United States Patent
Oh et al.

(10) Patent No.: US 9,542,124 B2
(45) Date of Patent: Jan. 10, 2017

(54) ELECTRONIC DEVICE AND METHOD FOR OPERATING THE SAME

(71) Applicant: SK hynix Inc., Icheon-Si (KR)

(72) Inventors: Byoung-Chan Oh, Icheon-Si (KR); Yoon-Jae Shin, Icheon-Si (KR)

(73) Assignee: SK hynix Inc., Icheon-Si (KR)

( * ) Notice: Subject to any disclaimer, the term of this patent is extended or adjusted under 35 U.S.C. 154(b) by 239 days.

(21) Appl. No.: 14/219,281

(22) Filed: Mar. 19, 2014

(65) Prior Publication Data

US 2014/0337568 A1 Nov. 13, 2014

(30) Foreign Application Priority Data

May 9, 2013 (KR) .......................... 10-2013-0052440

(51) Int. Cl.
| | |
|---|---|
| *G06F 1/26* | (2006.01) |
| *G05F 1/46* | (2006.01) |
| *G06F 3/06* | (2006.01) |
| *G11C 5/14* | (2006.01) |
| *H02M 3/156* | (2006.01) |
| *G11C 11/16* | (2006.01) |
| *G11C 13/00* | (2006.01) |
| *G05F 3/30* | (2006.01) |
| *G05F 1/70* | (2006.01) |
| *G05F 1/575* | (2006.01) |

(52) U.S. Cl.
CPC ............. *G06F 3/0673* (2013.01); *G11C 5/147* (2013.01); *G11C 11/1697* (2013.01); *G11C 13/0038* (2013.01); *H02M 3/1563* (2013.01); *G05F 1/465* (2013.01); *G05F 1/466* (2013.01); *G05F 1/575* (2013.01); *G05F 1/70* (2013.01); *G05F 3/30* (2013.01)

(58) Field of Classification Search
CPC ............ G05F 1/465; G05F 1/575; G05F 1/70; G05F 3/30
USPC .................................. 713/300, 320, 322, 323
See application file for complete search history.

(56) References Cited

U.S. PATENT DOCUMENTS

| | | | |
|---|---|---|---|
| 2002/0030472 A1* | 3/2002 | Miki | ........................ G05F 1/575 323/282 |
| 2009/0231930 A1* | 9/2009 | Kang | ................... G11C 11/4099 365/189.07 |
| 2010/0277988 A1* | 11/2010 | Park | ........................ G11O 5/147 365/189.09 |

FOREIGN PATENT DOCUMENTS

| | | |
|---|---|---|
| KR | 10-2001-0015460 A | 2/2001 |
| KR | 10-2007-0050308 A | 5/2007 |

\* cited by examiner

*Primary Examiner* — Michael J Brown
(74) *Attorney, Agent, or Firm* — Perkins Coie LLP

(57) ABSTRACT

Provided is an electronic device including a power supply circuit. The power supply circuit includes: a voltage driving unit configured to pull-up drive an output node and generate an output voltage; and a driving control unit configured to receive the output voltage, disable the voltage driving unit from the time at which a divided voltage obtained by dividing the output voltage at a set ratio becomes higher than a first level, and enable the voltage driving unit from the time at which the divided voltage becomes lower than a second level, which is higher than the first level.

25 Claims, 8 Drawing Sheets

ELECTRONIC DEVICE AND METHOD FOR OPERATING THE SAME

CROSS-REFERENCE TO RELATED APPLICATIONS

The present application claims priority of Korean Patent Application No. 10-2013-0052440, entitled "CIRCUIT FOR GENERATING VOLTAGE, SEMICONDUCTOR DEVICE, SYSTEM AND METHOD FOR GENERATING VOLTAGE USING THE SAME," and filed on May 9, 2013, which is incorporated herein by reference in its entirety.

TECHNICAL FIELD

This patent document relates to memory circuits or devices and their applications in electronic devices or systems.

BACKGROUND

Recently, as electronic devices or appliances trend toward miniaturization, low power consumption, high performance, multi-functionality, and so on, there is a demand for semiconductor devices capable of storing information in various electronic devices or appliances such as a computer, a portable communication device, and so on, and research and development for such semiconductor devices have been conducted. Examples of such semiconductor devices include semiconductor devices which can store data using a characteristic that switched between different resistance states according to an applied voltage or current, and can be implemented in various configurations, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device which generates a stable voltage by controlling a voltage driving unit using two reference voltages.

In one aspect, an electronic device is provided to include a power supply circuit that includes: a voltage driving unit configured to pull-up drive an output node and generate an output voltage; and a driving control unit configured to receive the output voltage, disable the voltage driving unit from the time at which a divided voltage obtained by dividing the output voltage at a set ratio becomes higher than a first level, and enable the voltage driving unit from the time at which the divided voltage becomes lower than a second level which is higher than the first level.

In another aspect, an electronic device is provided to include a power supply circuit which may include: a voltage driving unit configured to pull-up drive an output node; a voltage transmission line configured to transmit an output voltage generated at the output node to an input node; and a driving control unit configured to initially activate the voltage driving unit, and disable the voltage driving unit when a divided voltage obtained by dividing the voltage of the input node at a set ratio becomes higher than a first level, and enable the voltage driving unit when the divided voltage becomes lower than a second level which is higher than the first level.

In another aspect, an electronic device is provided to include a power supply circuit that includes: a voltage driving unit configured to pull-up drive an output node; a voltage transmission line configured to transmit a voltage of the output node to an input node; a first comparison unit configured to deactivate a first comparison signal when a divided voltage obtained by dividing the voltage of the input node at a set ratio is lower than a first level, and activate the first comparison signal when the divided voltage is higher than the first level; a second comparison unit configured to deactivate a second comparison signal when the divided voltage is lower than a second level, which is higher than the first level, and activate the second comparison signal when the divided voltage is higher than the second level; and a driving control unit configured to disable the voltage driving unit when the first comparison signal transits from a deactivated state to an activated state, and enable the voltage driving unit when the second comparison signal transits from an activated state to a deactivated state.

In some implementations, the driving control unit enables the voltage driving unit when the divided voltage is lower than the first level.

In some implementations, the driving control unit may include: a voltage division unit configured to divide the output voltage at the set ratio and generate the divided voltage; a first comparison unit configured to compare the divided voltage with a voltage having the first level and generate a first comparison signal; a second comparison unit configured to compare the divided voltage with a voltage having the second level and generate a second comparison signal; and a enable signal generating unit configured to enable or disable the voltage driving unit in response to the first comparison signal and the second comparison signal.

In some implementations, the first comparison unit deactivates the first comparison signal when the divided voltage is lower than the first level, and activates the first comparison signal when the divided voltage is higher than the first level.

In some implementations, the second comparison unit deactivates the second comparison signal when the divided voltage is lower than the second level, and activates the second comparison signal when the divided voltage is higher than the second level.

In some implementations, the enable signal generating unit disables the voltage driving unit when the first comparison signal transits from a deactivated state to an activated state, and enables the voltage driving unit when the second comparison signal transits from an activated state to a deactivated state.

In some implementations, the enable signal generating unit enables the voltage driving unit when the first comparison signal is deactivated.

In some implementations, the electronic device further comprises a semiconductor memory that includes: a cell array comprising a plurality of storage cells configured to store data; and a control circuit configured to write data to the plurality of storage cells or read data from the plurality of memory cells, and the power supply circuit supplies power used in one or more of the cell array and the control circuit.

In some implementations, the plurality of storage cells include a volatile memory cell which requires electricity to maintain data stored therein.

In some implementations, the plurality of storage cells include a nonvolatile memory cell which does not require electricity to maintain data stored therein.

In some implementations, the plurality of storage cells comprise a variable resistance element of which a resistance value is set according to the value of data stored therein.

In some implementations, the variable resistance element comprises one or more of a metal oxide, a phase change material, and a structure having a tunnel barrier layer interposed between two magnetic layers.

In some implementations, the enable signal generating unit enables the voltage driving unit when the first comparison signal is deactivated.

In some implementations, the voltage transmission line delays the voltage of the output node and transmits the delayed voltage to the input node.

In some implementations, the voltage transmission line delays the voltage of the output node and in transmitting the output voltage from the output node to the input node.

In some implementations, the electronic device further includes a microprocessor which may include: a control unit that is configured to receive a signal including a command from an outside of the microprocessor, and performs extracting, decoding of the command, or controlling input or output of a signal of microprocessor; and an operation unit configured to perform an operation based on a result that the control unit decodes the command; and a memory unit configured to store data for performing the operation, data corresponding to a result of performing the operation, or an address of data for which the operation is performed, wherein one or more of the control unit, the operation unit and the memory unit are received power of the power supply circuit.

In some implementations, the electronic device further includes a processor which may include: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein one or more of the core unit, the cache memory unit and the bus interface are received power of the power supply circuit.

In some implementations, the electronic device further includes a processing system which may include: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between the processor, the auxiliary memory device or the main memory device and the outside, wherein one or more of the processor, the auxiliary, the main memory device and the interface device are received power of the power supply circuit.

In some implementations, the electronic device further includes a data storage system which may include: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein one or more of the storage, the controller, the temporary storage and the interface are received power of the power supply circuit.

In some implementations, the electronic device further includes a memory system which may include: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein one or more of the memory, the memory controller, the buffer memory and the interface are received power of the power supply circuit.

In another aspect, a method is provided for operating an electronic device including a power supply device. The method may include: pull-up driving the output node when a divided voltage obtained by dividing the voltage of the input node at a set ratio is lower than a first level; stopping pull-up driving the output node when the divided voltage becomes higher than the first level; and pull-up driving the output node when the divided voltage becomes lower than a second level higher than the first level.

In some implementations, the stopping pull-up driving of the output node includes: comparing the divided voltage to the first level, and generating a first comparison signal which is deactivated when the divided voltage is lower than the first level and activated when the divided voltage is higher than the first level; and stopping pull-up driving the output node when the first comparison signal transits from a deactivated state to an activated state.

In some implementations, the stopping pull-up driving of the output node includes: comparing the divided voltage to the second level, and generating a second comparison signal which is deactivated when the divided voltage is lower than the second level and activated when the divided voltage is higher than the second level; and pull-up driving the output node when the second comparison signal transits from an activated state to a deactivated state.

In some implementations, the stopping pull-up driving of the output node may include: comparing the divided voltage with the first level; and stopping pull-up driving the output node when the divided voltage is higher than the first level.

In some implementations, the stopping pull-up driving of the output node from the time at which the divided voltage becomes lower than the second level may include: comparing the divided voltage to the second level; and pull-up driving the output node when the divided voltage is lower than the second level.

In some implementations, the voltage of the output node is delayed while being transmitted from the output node to the input node.

In some implementations, the method may further include: generating a comparison signal based on the comparison result; and performing or stopping the pull-up driving of the output node based on the comparison signal.

In some implementations, the pull-up driving of the output node when the divided voltage is lower than the first level, the stopping pull-up driving of the output node from the time at which the divided voltage becomes higher than the first level, and the pull-up driving of the output node from the time at which the divided voltage becomes lower than the second level comprise generating the divided voltage by dividing the voltage of the input node.

In yet another aspect, an electronic device is provided to include a power supply circuit which may include: a voltage driving unit generating an output voltage by driving an output node if activated and floating an output node if deactivated, wherein the output voltage is fed back to an input node of a power supply circuit to provide an input voltage; and a driving control unit receiving the input voltage and activating or deactivating an enable signal to activate or deactivate the voltage pull-up driving unit in consideration of a delay in feeding back the output voltage from the output node to the input node.

In some implementations, the driving control unit activates or deactivates the enable signal by using a first reference signal lower than a target value of the output voltage generated at the output node and a second reference signal higher than the target value.

In some implementations, the driving control unit activates or deactivates the enable signal before the output voltage reaches a target value of the output voltage.

These and other aspects, implementations and associated advantages are described in greater detail in the drawings, the description and the claims.

DETAILED DESCRIPTION

Various examples and implementations of the disclosed technology are described below in detail with reference to the accompanying drawings.

A semiconductor device is used in various fields. For example, a semiconductor device may be used to store various data. For a semiconductor device that is used in various portable devices including a desktop computer and a notebook computer, the semiconductor device is required to provide a large capacity, high performance, miniaturization, and low power consumption.

A semiconductor device generates various internal voltage levels using a power supply voltage supplied from outside. In particular, as a specific example, a semiconductor memory device such as DRAM generates a VCORE voltage used in a core area of a memory device, a VPP voltage higher than a power supply voltage VDD applied to a cell transistor gate (word line), and a negative voltage VBB lower than a ground voltage VSS used in a bulk of a cell transistor.

In order to reduce power consumption of the semiconductor device, the voltage level of the power supply voltage VDD supplied from outside of the semiconductor device for use inside the device has been gradually decreased. Thus, if a voltage higher than the power supply voltage VDD, for example, the VPP voltage (hereafter, referred to as a high voltage) becomes necessary, the semiconductor device needs to internally generate a high voltage using the power supply voltage VDD. Thus, the semiconductor device includes a power circuit which boosts the power supply voltage VDD to generate a high voltage.

Figure 1:
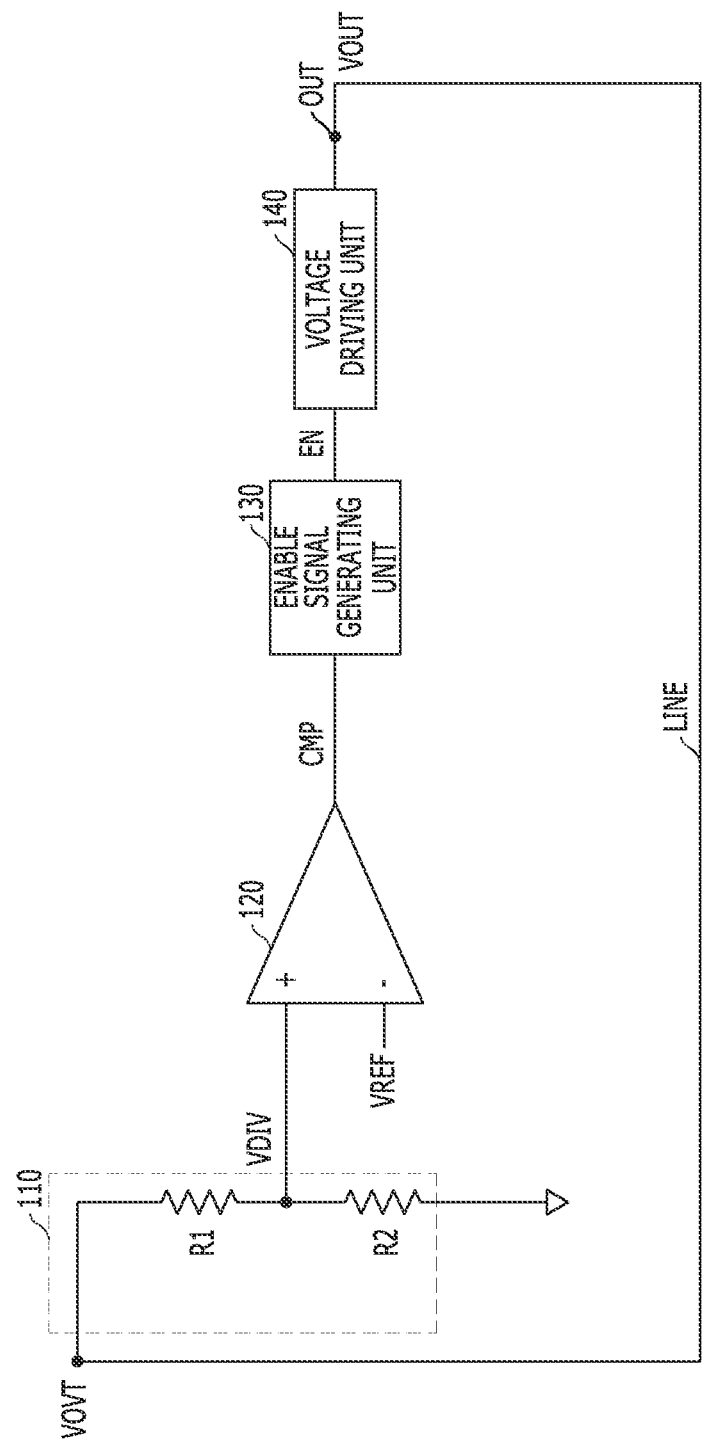
FIG. 1 is an example of a configuration diagram of a power supply circuit or device.

FIG. 1 is an example of a configuration diagram of a power supply circuit or device.

As illustrated in FIG. 1, the power supply circuit includes a voltage division unit 110, a comparison unit 120, a enable signal generating unit 130, and a voltage driving unit 140.

The voltage driving unit 140 generates an output voltage VOUT which is fed to the voltage division unit 110. The voltage driving unit 140 is configured to pull-up drive an output node OUT when the voltage driving unit 140 is enabled or activated and float the output node OUT to generate an output voltage VOUT when the voltage driving unit 140 is disabled ordeactivated. The voltage driving unit 140 is enabled or disabled in response to an enable signal EN from the enable signal generating unit 130.

The voltage division unit 110 is configured to divide the output voltage VOUT by a set or predetermined ratio and generate a divided voltage VDIV. The voltage division unit 110 may include two or more resistors R1 and R2. In FIG. 1, when the resistance value of the first resistor R1 is represented by R1 and the resistance value of the second resistor R2 is represented by R2, the divided voltage VDIV may be equal to a value obtained by multiplying R2/(R1+R2) by the output voltage VOUT.

The comparison unit 120 is coupled between the voltage division unit 110 and the enable signal generating unit 130 and is configured to compare the divided voltage VDIV to a reference voltage VREF and to output a comparison result CMP. As discussed above, the divided voltage VDIV is obtained by dividing the output voltage VOUT of the voltage driving unit 140 by a predetermined ratio. For example, the comparison unit 120 outputs a high-level signal when the divided voltage VDIV is higher than the reference voltage VREF, and outputs a low-level signal when the divided voltage VDIV is lower than the reference voltage VREF.

The enable signal generating unit 130 is configured to control the voltage driving unit 140 in response to the comparison result CMP. More specifically, when the comparison result CMP is low, it indicates that the output voltage VOUT did not reach a target level and needs to increase. Accordingly, the enable signal generating unit 130 is activated to provide the enable signal EN to the voltage driving unit 140. If the voltage driving unit 140 is enabled, the voltage level of the output voltage VOUT increases. Furthermore, when the comparison result CMP is high, it indicates that the output voltage VOUT reaches the target level. In this case, the enable signal generating unit 130 deactivates the enable signal EN to cause the voltage driving unit 140 to be deactivated. As a result, the voltage level of the output voltage VOUT decreases.

The target level indicates the voltage level of the output voltage VOUT which is generated by the power supply circuit. The target level corresponds to a value obtained by multiplying (R1+R2)/R2 by the voltage level of the reference voltage VREF.

The power supply circuit increases the voltage level of the output voltage VOUT when the divided voltage VDIV is smaller than the reference voltage VREF, and decreases the voltage level of the output voltage VOUT when the divided voltage VDIV is greater than the reference voltage VREF. Under this design, the power supply circuit generates the output voltage VOUT with a set or predetermined voltage level (for example, target level). However, as the output voltage VOUT is transmitted to the voltage division unit 110 through a transmission line LINE coupled between the units 140 and 110, certain problems may occur. Since the output voltage VOUT may be delayed by presence of loadings on the transmission line LINE, this delay can cause the voltage driving unit 140 to unable to immediately respond to changes in voltage level of the output voltage VOUT. Such a problem will be further discussed below with reference to FIG. 2.

Figure 2:
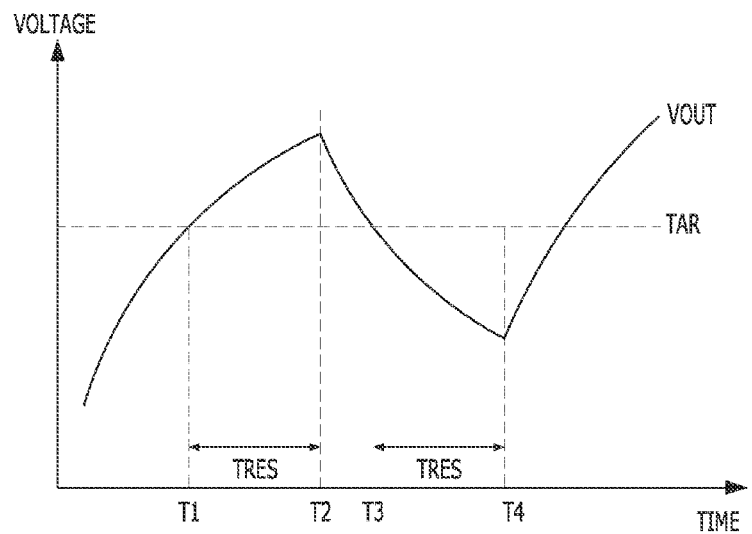
FIG. 2 is a diagram illustrating the waveform of an output voltage VOUT generated from the power supply circuit.

FIG. 2 is a diagram illustrating the waveform of the output voltage VOUT generated from the power supply circuit.

The target level TAR indicates the voltage level of the output voltage VOUT in an ideal state. As described above with reference to FIG. 1, the target level TAR may have a value obtained by multiplying (R1+R2)/R2 by the voltage level of the reference voltage VREF.

When the power supply circuit is powered up, the voltage driving unit 140 drives the output node OUT to increase the voltage level of the output voltage VOUT. As the output voltage VOUT increases, the voltage level of the divided voltage VDIV also increases. Ideally, the voltage driving unit 140 must be disabled or deactivated immediately at the time T1 when the voltage level of the output voltage VOUT becomes higher than the target level TAR. In practical circuit implementations, however, the voltage driving unit 140 is deactivated at the time T2 subsequent to T1 when the voltage level of the divided voltage VDIV becomes higher than the reference voltage VREF. As a result, the output voltage VOUT starts to decrease at T2. Since it takes time in transmitting the output voltage VOUT from the output node OUT to the input node of the voltage division unit 110, there exists a time difference between T1 and T2. The time period from T1 to T2 may be referred to as a response time TRES.

When the output node OUT of the voltage driving unit 140 is floated at the time T2, the voltage level of the output voltage VOUT starts to decrease, and thus the voltage level of the divided voltage VDIV also starts to decrease. Ideally, the voltage driving unit 140 must be enabled immediately at the time T3 when the voltage level of the output voltage VOUT becomes lower than the target level TAR. In practical circuit operations, however, the voltage driving unit 140 is activated at the time T4 when the voltage level of the divided voltage VDIV becomes lower than the reference voltage VREF. As explained above, since it takes time in transmitting the output voltage VOUT from the output node OUT to the input node of the voltage division unit 110 generating the divided voltage VDIV, the time T4 is delayed by the response time TRES from the time T3. Once the voltage driving unit 140 is enabled or activated, the output voltage VOUT starts to increase from the time T4.

As illustrated in FIG. 2, the voltage level of the output voltage VOUT is not constant at the target level TAR, but rather fluctuates a lot due to the response time TRES. Thus, the power supply device cannot provide the voltage level of the output voltage VOUT in a stable manner. In recognition of the above, the examples of semiconductor devices disclosed below are implemented.

Figure 3:
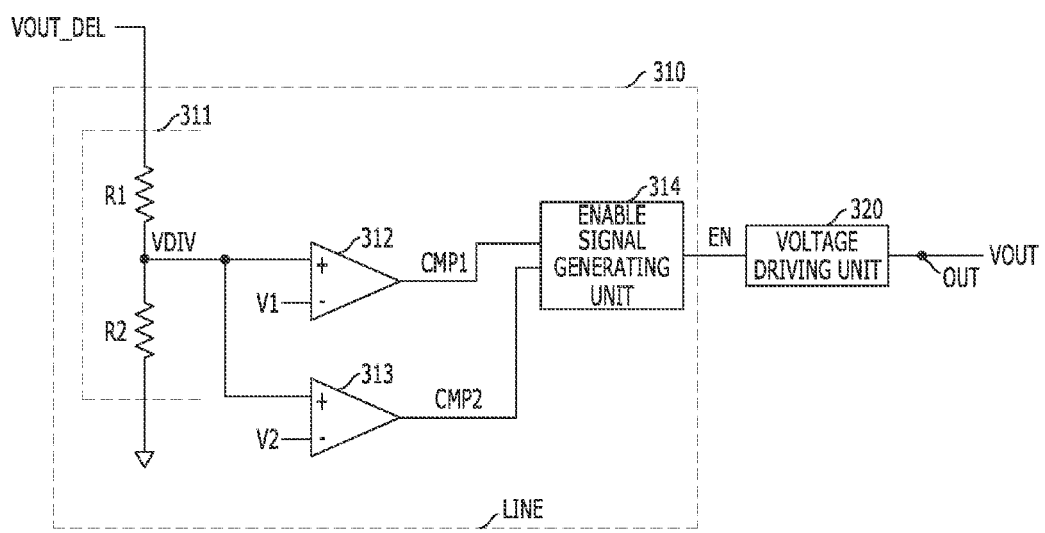
FIG. 3 is an example of a configuration diagram of a power supply circuit or device.

FIG. 3 is an example of a configuration diagram of a power supply device.

As illustrated in FIG. 3, the power supply circuit includes a driving control unit 310 and a voltage driving unit 320. The voltage driving unit 320 is configured to pull-up drive an output node OUT and generate an output voltage VOUT. The driving control unit 310 is configured to receive the output voltage VOUT and control timings to activate or deactivate the voltage driving unit 320. For example, the driving control unit 310 disables or deactivates the voltage driving unit 320 when a divided voltage VDIV obtained by dividing the output voltage VOUT_DEL at a set or predetermined voltage becomes higher than a first level, and enables or activates the voltage driving unit 320 when the divided voltage VDIV becomes lower than a second level higher than the first level.

The output voltage generated from the output node OUT of the voltage driving unit 320 is fed back to the driving control unit 310. In the process of feeding back the output voltage from the output node OUT to the driving control unit 310, a delay occurs. Accordingly, the output voltage generated from the output node OUT of the voltage driving unit 320 has a phase difference from the input voltage of to the driving control unit 310. Hereinafter, the voltage generated from the output node OUT of the voltage driving unit 320 is referred to as an output voltage VOUT, and the voltage inputted to the driving control unit 310 is referred to as a delayed output voltage VOUT_DEL. The delayed output voltage VOUT_DEL is identical to the output voltage VOUT except that the delayed output voltage VOUT_DEL is delayed by a set or predetermined delay value in comparison to the output voltage VOUT.

The driving control unit 310 enables or disables the voltage driving unit 320 in response to the delayed output voltage VOUT_DEL. For example, the driving control unit 310 enables or activates the voltage driving unit 320 when the divided voltage VDIV obtained by dividing the delayed output voltage VOUT_DEL at a set or predetermined ratio is lower than the first level, disables or deactivates the voltage driving unit 320 when the divided voltage VDIV becomes higher than the first level, and enables or activates the voltage driving unit 320 when the divided voltage VDIV becomes lower than the second level.

When the driving control unit 310 disables or deactivates the voltage driving unit 320 when the divided voltage VDIV becomes higher than the first level, it indicates that the divided voltage VDIV had been lower than the first level but increased to be higher than the first level. When the driving control unit 310 enables or activates the voltage driving unit 320 when the divided voltage VDIV becomes lower than the second level, it indicates that the divided voltage VDIV had been higher than the second level but decreased to be lower than the second level.

The driving control unit 310 includes a voltage division unit 311, a first comparison unit 312, a second comparison unit 313, and a enable signal generating unit 314. The voltage division unit 311 is configured to divide the delayed output voltage VOUT_DEL at a set or predetermined ratio and generate the divided voltage VDIV. The first comparison unit 312 is configured to compare the divided voltage VDIV with a voltage V1 having the first level and generate a first comparison signal CMP1. The second comparison unit 313 is configured to compare the divided voltage VDIV with a voltage V2 having the second level and generate a second comparison signal CMP2. The enable signal generating unit 314 is configured to activate or deactivate the voltage driving unit 320 based on the first comparison signal CMP1 and the second comparison signal CMP2.

The voltage division unit 311 divides the delayed output voltage VOUT_DEL at a set division ratio and generates the divided voltage VDIV. The voltage division unit 311 may include a number of resistors. As illustrated in a specific example of FIG. 3, the voltage division unit 311 includes two resistors R1 and R2. The divided voltage VDIV of the FIG. 3 has a value obtained by multiplying the delayed output voltage VOUT_DEL by R2/(R1+R2).

The first comparison unit 312 compares the divided voltage VDIV with the first voltage V1 having the first level. Based on the comparison result, the first comparison unit 312 activates or deactivates the first comparison signal CMP1. For example, the first comparison unit 312 deactivates the first comparison signal CMP1 when the divided voltage VDIV is lower than the first level, and activates the first comparison signal CMP1 when the divided voltage VDIV is higher than the first level.

The second comparison unit 313 compares the divided voltage VDIV with the second voltage V2 having the second level and activates or deactivates the second comparison signal CMP2 based on the comparison result. For example, the second comparison unit 313, deactivates the second comparison signal CMP2 when the divided voltage VDIV is lower than the second level, and activates the second comparison signal CMP2 when the divided voltage VDIV is higher than the second level.

The enable signal generating unit 314 activates or deactivates an enable signal EN to activate or deactivate the voltage driving unit 320 based on the first comparison signal CMP1 and the second comparison signal CMP2. For example, the enable signal generating unit 314 activates the voltage pull-up driving unit 320 when the first comparison signal CMP1 is deactivated, disables or deactivates the voltage driving unit 320 when the first comparison signal CMP1 transits from a deactivated state to an activated state, and enables or activates the voltage driving unit 320 when the second comparison signal CMP2 transits from an activated state to a deactivated state. The enable signal generating unit 314 generates an enable signal EN which activates or deactivates the voltage pull-up driving unit 320. For example, the voltage driving unit 320 is activated if the enable signal EN is activated and is deactivated if the enable signal EN is deactivated.

The voltage driving unit 320 generates the output voltage VOUT at the output node OUT in response to the activation or deactivation of the enable signal EN. More specifically, the voltage driving unit 320 pull-up drives the output node OUT when the enable signal EN is activated, and floats the output node OUT when the enable signal EN is deactivated. When the voltage driving unit 320 is enabled or activated, the voltage level of the output voltage VOUT increases, and when the voltage driving unit 320 is disabled or deactivated, the voltage level of the output voltage VOUT decreases.

The operation of the power supply device with the above-described configuration will be explained as follows.

In operating the power supply device, the various reference voltages including the target level, the first level, the second level, the first critical level and the second critical level are used. The target level is a target voltage level of the output voltage VOUT generated at the output node OUT of the power supply device, the first level is the reference voltage for determining whether to activate or deactivate the first comparison signal CMP1, and the second level is the reference voltage for determining whether to activate or deactivate the second comparison signal CMP2. In FIG. 3, the first critical level is obtained by multiplying (R1+R2)/R2 by the first level, and the second critical level is obtained by multiplying (R1+R2)/R2 by the second level. The first critical level is lower than the target level, and the second critical level is higher than the target level.

At the initial stage, the output node OUT is not yet driven. The output voltage VOUT is lower than the target level, and the divided voltage VDIV is lower than the first level. The first comparison signal CMP1 is deactivated and in response to the deactivation of the comparison signal CMP1, the enable signal generating unit 314 activates the enable signal EN. In response to the activation of the enable signal EN, the voltage pull-up driving unit 320 drives the output node OUT. As the voltage pull-up driving unit 320 drives the output node OUT, the voltage level of the output voltage VOUT starts to increase. After a pre-set time has passed from when the voltage level of the output voltage VOUT started to increases, the voltage levels of the delayed output voltage VOUT_DEL and the divided voltage VDIV start to increase.

The voltage level of the output voltage VOUT continuously increases and reaches the first critical level. After a pre-set time has passed from the time when the voltage level of the output voltage VOUT reaches the first critical level, the voltage level of the delayed output voltage VOUT_DEL becomes higher than the first critical level and the voltage level of the divided voltage VDIV becomes higher than the first level. When the voltage level of the divided voltage VDIV becomes higher than the first level, the first comparison signal CMP1 transits from a deactivated state to an activated state. When the first comparison signal CMP transits from a deactivated state to an activated state, the enable signal generating unit 314 stops pull-up driving of the output node OUT and floats the output node OUT. Thus, the voltage level of the output voltage VOUT starts to decrease. After a pre-set time has passed from when the voltage level of the output voltage VOUT started to decreases, the voltage levels of the delayed output voltage VOUT_DEL and the divided voltage VDIV start to decrease.

The voltage level of the output voltage VOUT continuously decreases and reaches the second critical level. After a pre-set time has passed from when the voltage level of the output voltage VOUT reached the second critical level, the voltage level of the delayed output voltage VOUT_DEL becomes lower than the second critical level and the voltage level of the divided voltage VDIV becomes lower than the second level. When the voltage level of the divided voltage VDIV becomes lower than the second level, the second comparison signal CMP2 transits from an activated state to a deactivated state. When the second comparison signal CMP2 transits from an activated state to a deactivated state, the driving pull-up driving control unit 314 resumes pull-up driving of the output node OUT. After a pre-set time has passed from when the voltage level of the output voltage VOUT started to increase, the voltage levels of the delayed output voltage VOUT_DEL and the divided voltage VDIV start to increase.

As described above, the driving pull-up driving control unit 314 repeats driving and floating the output node OUT and the output voltage VOUT repetitively increases and decreases.

Figure 4:
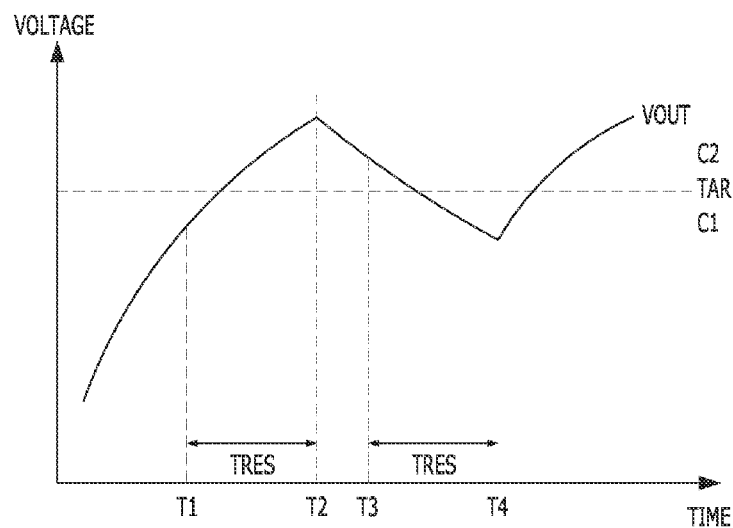
FIG. 4 is a waveform diagram of an output voltage VOUT of the power supply circuit of FIG. 3.

FIG. 4 is a waveform diagram of the output voltage VOUT that is obtained using the power supply circuit of FIG. 3.

As described above, the first critical level C1 is obtained by multiplying the first level by (R1+R2)/R2, and the second critical level C2 is obtained by multiplying the second level by (R1+R2)/R2. The target level TAR is a target voltage level of the output voltage VOUT.

Assume that the voltage level of the output voltage VOUT is lower than the first critical level C1 at the initial stage. When the power supply circuit starts to generate a voltage, the output voltage VOUT is lower than the first critical level C1. In order to increase the voltage level of the output voltage VOUT, the power supply circuit pull-up drives the output node OUT.

The voltage level of the output voltage VOUT continues to increase and reaches the first critical level C1 at the time T1. The power supply device drives the output node OUT until the response time TRES passes from the time T1 and the power supply circuit stops pull-up driving the output node OUT at the time T2. Thus, the voltage level of the output voltage VOUT starts to decrease from the time T2. The voltage level of the output voltage VOUT continues to decrease and reaches the second critical level C2 at the time T2. The power supply device does not drive the output node OUT until the response time TRES passes from the time T3 and the power supply device resumes the driving of the output node OUT at the time T4. Thus, the voltage level of the output voltage VOUT starts to increase from the time T4. The power supply device repeats driving and floating the output node OUT. Accordingly, the voltage level of the output voltage VOUT repetitively increases and decreases.

The power supply circuit sets the first critical level C1 to be lower than the target level TAR and operates to stop the pull-up driving of the output node OUT after the response time TRES has passed from when the output voltage VOUT reaches the first critical level C1. As compared to techniques used in conventional power supply devices, the power supply circuit stops pull-up driving the output node OUT at an earlier time. Furthermore, the power supply device sets the second critical level C2 to be higher than the target level TAR and operates to restart the pull-up driving of the output node OUT after the response time TRES has passed from when the output voltage VOUT reached the second critical level C2. As compared to techniques used in conventional power supply devices, the power supply device restarts pull-up driving of the output node OUT at an earlier time. Thus, the change in voltage level of the output voltage VOUT is smaller than that in conventional power supply devices. Accordingly, the power supply device can provide the voltage level of the output voltage VOUT in much more stable manner. The stability of the output voltage VOUT may be controlled by changing settings of the first and second critical levels C1 and C2.

Figure 5:
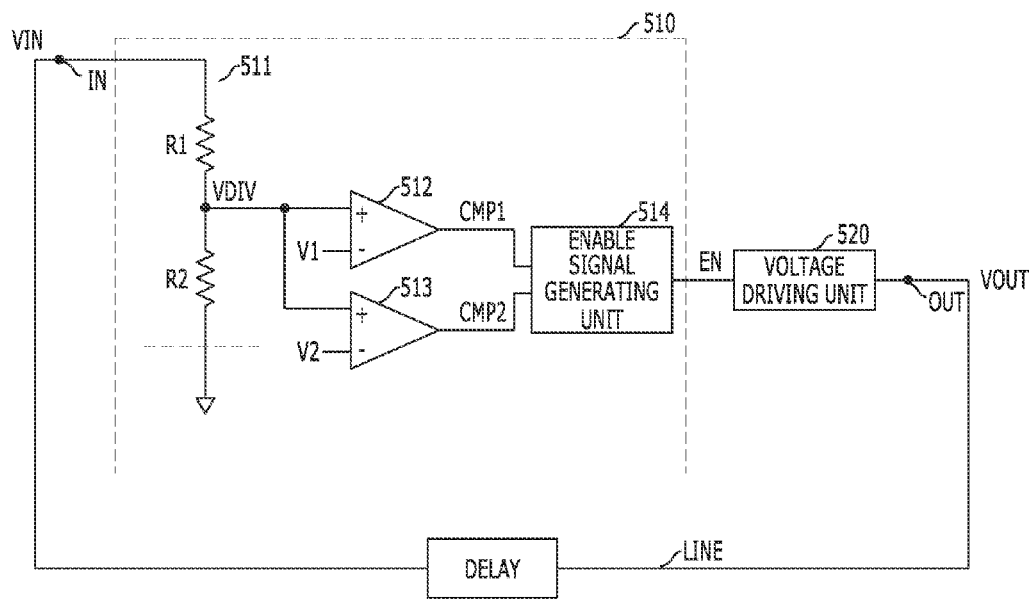
FIG. 5 is an example of a configuration diagram of a power supply circuit or device.

FIG. 5 is an example of a configuration diagram of a power supply circuit or device.

As illustrated in FIG. 5, the power supply circuit includes a voltage driving unit 520, a voltage transmission line LINE, and a driving control unit 510. The voltage driving unit 520 is configured to pull-up drive an output node OUT. The voltage transmission line LINE is configured to transmit a voltage of the output node (hereafter, referred to as output voltage VOUT) to an input node IN. The driving control unit 510 is configured to activate or deactivate the voltage driving unit 520 depending on the voltage level of a divided voltage VDIV. The divided voltage VDIV is obtained by dividing a voltage of the input node (hereafter, referred to as input voltage VIN) by a predetermined ratio. The driving control unit 510 deactivates the voltage driving unit 520 from when a divided voltage becomes higher than a first level, and activates the voltage driving unit 520 from when the divided voltage VDIV becomes lower than a second level higher than the first level.

In operation, the output voltage VOUT generated from the voltage driving unit 320 is transmitted to the input node VIN of the controller 510 through the voltage transmission line LINE. The voltage transmission line LINE delays the output voltage VOUT and transmits the delayed voltage as the input voltage VIN. The voltage transmission line LINE may include a delay unit DELAY configured to delay the output voltage VOUT. The delay unit DELAY may provide a delay caused by various loads such as a RC delay, which are connected to the power supply. The input voltage VIN is identical to the output voltage VOUT except that the input voltage VIN is delayed by the delay unit DELAY on the voltage transmission line LINE.

The driving control unit 510 enables or disables the voltage pull-up driving unit 520 in response to the input voltage VIN. The divided voltage VDIV is obtained by dividing the input voltage VIN at a set or predetermined division ratio. The driving control unit 510 enables or activates the voltage driving unit 520 when the divided voltage VDIV is lower than the first level, disables or deactivates the voltage driving unit 520 from when the divided voltage VDIV becomes higher than the first level, and enables or activates the voltage driving unit 520 from when the divided voltage VDIV becomes lower than the second level.

The driving control unit 510 includes a voltage division unit 511, a first comparison unit 512, a second comparison unit 513, and a enable signal generating unit 514. The voltage division unit 511 is configured to divide the input voltage VIN by a predetermined ratio and provide the divided voltage VDIV. The first comparison unit 512 is configured to compare the divided voltage VDIV with a voltage V1 having the first level and generate a first comparison signal CMP1. The second comparison unit 513 is configured to compare the divided voltage VDIV with a voltage V2 having the second level and generate a second comparison signal CMP2. The enable signal generating unit 514 is configured to activate or deactivate the voltage driving unit 520 based on the first and second comparison signals CMP1 and CMP2.

In some implementations, the voltage division unit 511, the first comparison unit 512, the second comparison unit 513, and the enable signal generating unit 514 can have the same configuration and operation as the voltage division unit 311, the first comparison unit 312, the second comparison unit 313, and the enable signal generating unit 314 of FIG. 3.

The operation of the power supply circuit or device with the above-described configuration will be described.

In operating the power supply device, the various reference voltages including the target level, the first level, the second level, the first critical level and the second critical level are used. The target level is a target voltage level of the output voltage VOUT generated at the output node OUT of the power supply device, the first level is the reference voltage for determining whether to activate or deactivate the first comparison signal CMP1, and the second level is the reference voltage for determining whether to activate or deactivate the second comparison signal CMP2. In FIG. 5, the first critical level is obtained by multiplying (R1+R2)/R2 by the first level, and the second critical level is obtained by multiplying (R1+R2)/R2 by the second level. The first critical level is lower than the target level, and the second critical level is higher than the target level.

At the initial stage, the output node OUT is not yet driven. The output voltage VOUT is lower than the target level, and the divided voltage VDIV is lower than the first level. The first comparison signal CMP1 is deactivated and in response to the deactivation of the comparison signal CMP1, the enable signal generating unit 514 activates the enable signal EN.

In response to the activation of the enable signal EN, the voltage driving unit 520 drives the output node OUT. As the voltage driving unit 520 drives the output node OUT, the voltage level of the output voltage VOUT starts to increase. After a pre-set time has passed from when the voltage level of the output voltage VOUT starts to increase, the output voltage VOUT is transmitted to the input node IN through the voltage transmission line LINE and then, the voltage levels of the input voltage VIN and the divided voltage VDIV start to increase.

The voltage level of the output voltage VOUT continuously increases and reaches the first critical level. After a pre-set time has passed from when the voltage level of the output voltage VOUT reached the first critical level, the voltage level of the input voltage VIN becomes higher than the first critical level, and the voltage level of the divided voltage VDIV becomes higher than the first level. When the voltage level of the divided voltage VDIV becomes higher than the first level, the first comparison signal CMP1 transits from a deactivated state to an activated state. When the first comparison signal CMP1 transits from a deactivated state to an activated state, the voltage pull-up driving unit 520 stops pull-up driving of the output node OUT and floats the output node OUT. Thus, the voltage level of the output voltage VOUT starts to decrease. After a pre-set time has passed from when the voltage level of the output voltage VOUT started to decrease, the output voltage VOUT is transmitted to the input node IN and then, the voltage levels of the input voltage VIN and the divided voltage VDIV start to decrease.

The voltage level of the output voltage VOUT continuously decreases and reaches the second critical level. After a pre-set time has passed from when the voltage level of the output voltage VOUT reaches the second critical level, the voltage level of the input voltage VIN becomes lower than the second critical level and the voltage level of the divided voltage VDIV becomes lower than the second level. When the voltage level of the divided voltage VDIV becomes lower than the second level, the second comparison signal CMP2 transits from an activated state to a deactivated state. When the second comparison signal CMP2 transits from an activated state to a deactivated state, the voltage driving unit 520 resumes pull-up driving of the output node OUT. After a pre-set time has passed from when the voltage level of the output voltage VOUT started to increase, the output voltage VOUT is transmitted to the input node IN through the voltage transmission line LINE and the voltage levels of the input voltage VIN and the divided voltage VDIV start to increase.

As described above, the enable signal generating unit 520 repeats driving and floating the output node OUT and thus the output voltage VOUT and the input voltage VIN repetitively increase and decrease.

The output voltage VOUT generated in the power supply circuit or device of FIG. 5 has the same waveform as illustrated in FIG. 4. As compared to the techniques used in conventional power supply devices, the power supply device of FIG. 5 drives or stops driving of the output node OUT at an earlier time by using a response time. Thus, the output voltage VOUT does not change much and can be much more stable.

Figure 6:
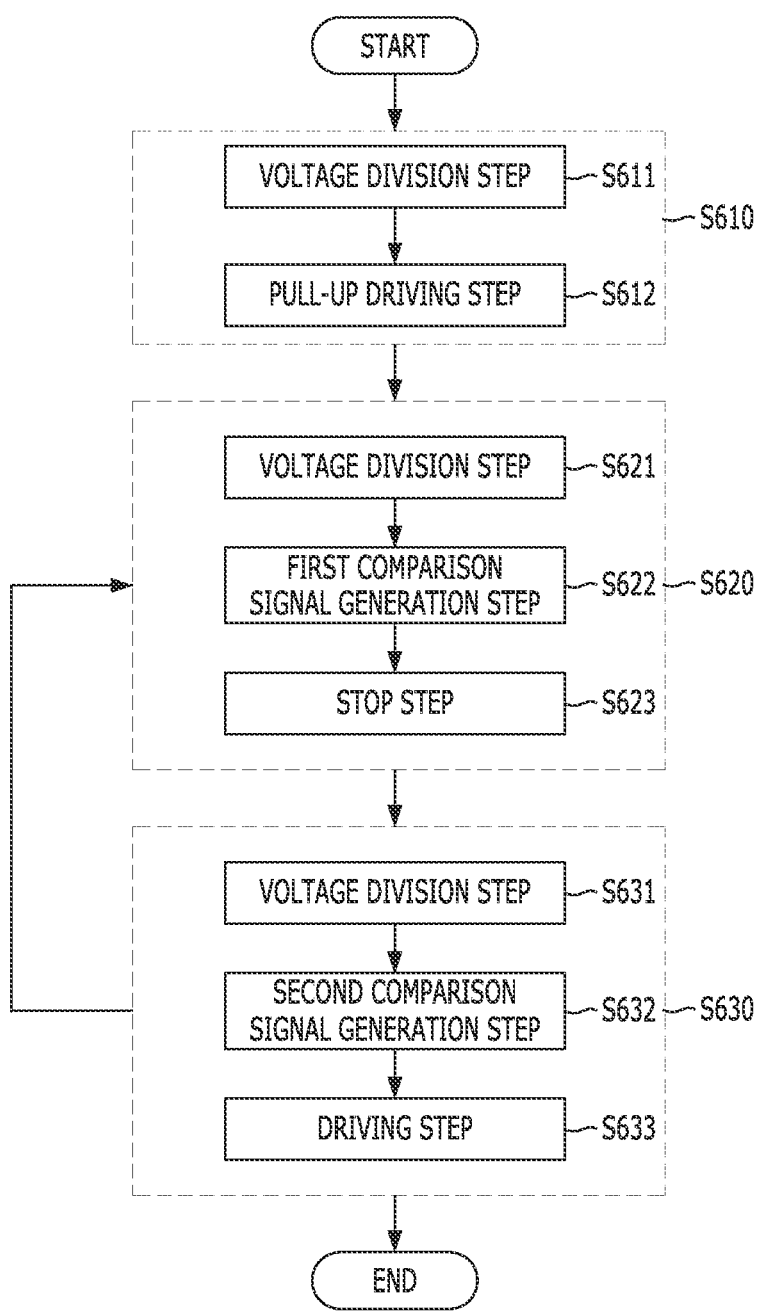
FIG. 6 is a flowchart for explaining a method for operating an electronic device including a power supply circuit.

FIG. 6 is a flowchart for explaining a method for operating an electronic device including a power supply circuit and for providing a desired voltage using a power supply circuit. As discussed above, the power supply circuit operates to drive an output node OUT and feeds back the output voltage VOUT to the input node.

The power supply circuit drives an output node OUT in response to a voltage of an input node (hereafter, referred to as input voltage VIN) and feeds back the voltage of the output node (hereafter, referred to as output voltage VOUT) to the input node. The method in FIG. 6 includes a step S610 of pull-up driving the output node OUT when a divided voltage VDIV obtained by dividing the input voltage VIN at a set ratio is lower than a first level, a step S620 of stopping pull-up driving the output node from the time at which the divided voltage VDIV becomes higher than the first level, and a step S630 of pull-up driving the output node OUT from the time at which the divided voltage VDIV becomes lower than a second level higher than the first level.

While the output voltage VOUT generated by the power supply circuit is fed back to the input node IN, the output voltage VOUT is delayed by a predetermined delay value. The delay may be caused by the delay unit DELAY on the voltage transmission line LINE as described with reference to FIG. 5.

The power supply circuit operates to begin the pull-up driving the output node. At step 611, the voltage level of the divided voltage VDIV is obtained. Since it is the initial stage of the power supply circuit, the voltage level of the output voltage VOUT is lower than the first critical level. Thus, the voltage level of the divided voltage VDIV generated at the step S611 is lower than the first level. In order to increase the voltage level of the divided voltage VDIV, the output node OUT is pull-up driven at step S612.

When the output node OUT is pull-up driven at step 612, the voltage level of the output voltage VOUT increases, and the voltage levels of the input voltage VIN and the divided voltage VDIV increase. At step 621, the divided voltage VDIV is obtained. At step S622, the divided voltage VDIV is compared with the first level. Based on the comparison, a first comparison signal CMP1 is generated. The first comparison signal CMP1 is activated if the divided voltage DVID is higher than the first level and deactivated if the divided voltage DVID is lower than the first level. If the first comparison signal CMP1 is deactivated, the power supply circuit pull-up drives the output node. If the first comparison signal CMP1 transits from a deactivated state to an activated state, the flow goes to step S623. At step S623, pull-up driving of the output node OUT is stopped.

When the driving of the output node OUT is stopped in the step 623, the voltage level of the output voltage VOUT decreases, and the voltage levels of the input voltage VIN and the divided voltage VDIV decrease. At step 631, the divided voltage VDIV is obtained. At step 632, the divided voltage is compared with the second level. Based on the comparison, a second comparison signal CMP2 is generated. The second comparison signal CMP2 is activated if the divided voltage DVID is higher than the second level and deactivated if the divided voltage DVID is lower than the second level. If the second comparison signal CMP2 is activated, the power supply circuit floats the output node. If the divided voltage is lower than the second level and the second comparison signal CMP2 transits from an activated state to a deactivated state, the flow goes to step S633. At step S633, the output node is driven Then, the step S620 and the step S630 may be alternately performed by the power supply circuit.

The output voltage VOUT generated by the method for operating an electronic device has the same waveform as illustrated in FIG. 4. The voltage generation method of FIG. 6 may consider a response time when the output voltage VOUT increases, and stop pull-up driving the output node OUT earlier than timings in the related art. Furthermore, the voltage generation method of FIG. 6 may consider of a response time when the output voltage VOUT decreases, and start pull-up driving the output node OUT earlier than timings in related art. The output voltage VOUT doesn't fluctuate much and is stable.

Figure 7:
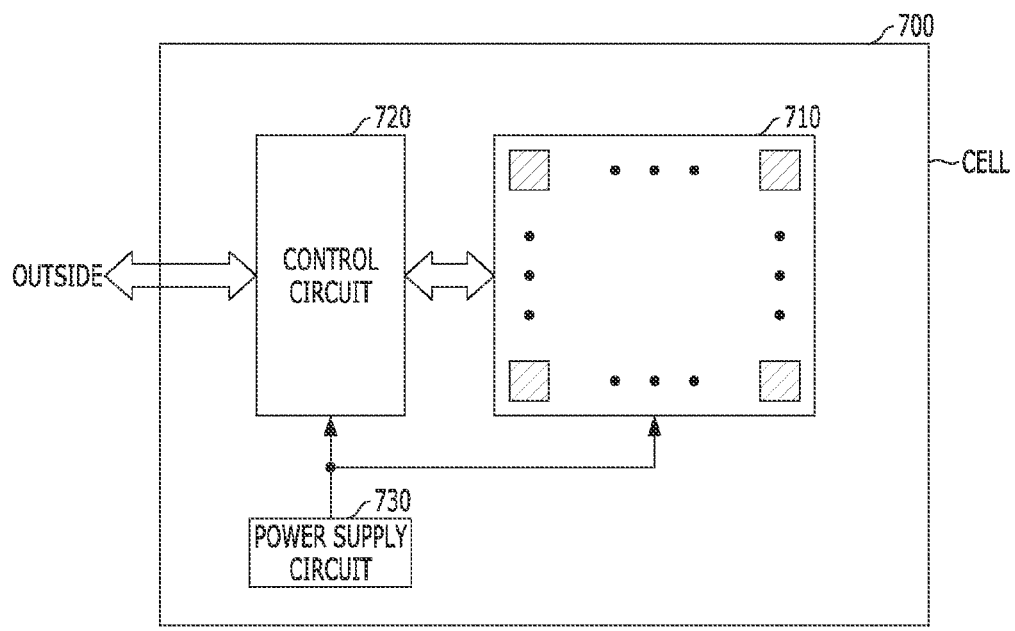
FIG. 7 is an example of a configuration diagram of a memory circuit or device.

FIG. 7 is an example of a configuration diagram of a memory circuit (device) 700.

As illustrated in FIG. 7, the memory circuit 700 includes a cell array 710, a control circuit 720, and a power supply circuit 730. The cell array 710 includes a plurality of store cells CELL configured to store data. The control circuit 720 is configured to write data to the plurality of storage cells CELL and read data from the plurality of storage cells CELL. The power supply circuit 730 is configured to supply power used in the cell array 710 and the control circuit 720.

The memory circuit 700 may include a memory device to store data. When the memory circuit 700 is a memory device, the memory device may include a volatile memory which requires electricity to maintain information stored therein or a nonvolatile memory which maintains information even though power is not supplied. When the memory circuit 700 is a nonvolatile memory, the semiconductor device may include DRAM (Dynamic Random Access Memory) or SRAM (Static Random Access Memory). When the memory circuit 700 is a nonvolatile memory, the memory circuit 700 may include ROM (Read Only Memory), Nor Flash Memory, NAND Flash Memory, PRAM (Phase Change Random Access Memory), RRAM (Resistive Random Access Memory), STTRAM (Spin Transfer Torque Random Access Memory), or MRAM (Magnetic Random Access Memory).

The storage cell of the memory circuit 700 may include a variable resistance element. Hereafter, the variable resistance element may exhibit a variable resistance characteristic, and include a single layer or multilayer. The variable resistance element may include a material used in RRAM, PRAM, MRAM, FRAM and the like, for example, a chalcogenide-based compound, a transition metal compound, a ferroelectric material, or a ferromagnetic material. However, the present implementations are not limited thereto, as long as the variable resistance element has a variable resistance characteristic of switching between different resistance states depending on a voltage or current applied across the variable resistance element.

More specifically, the variable resistance element may include metal oxide. The metal oxide may include a transition metal oxide such as nickel oxide, titanium oxide, hafnium oxide, zirconium oxide, tungsten oxide, or cobalt oxide and a perovskite-based material such as STO (SrTiO) or PCMO (PrCaMnO). Such a variable resistance element may exhibit a characteristic of switching between different resistance states through generation/disappearing of a current filament caused by behavior of vacancies.

Furthermore, the variable resistance element may include a phase change material. The phase change material may include a chalcogenide-based material such as GST (Ge—Sb—Te). As the variable resistance element is stabilized to any one of a crystalline state and an amorphous state by heat, the variable resistance element may switch between different resistance states.

Furthermore, the variable resistance element may have a structure having a tunnel barrier layer interposed between two magnetic layers. The magnetic layer may be formed of NiFeCo or CoFe, and the tunnel barrier layer may be formed of $Al_2O_3$. The variable resistance element may exhibit a characteristic of switching between different resistance states according to the magnetization direction of the magnetic layer. For example, the variable resistance element may have a low-resistance state when the magnetization directions of the two magnetic layers are parallel to each other, and may have a high-resistance state when the magnetization directions of the two magnetic layers are anti-parallel to each other.

The storage cell CELL is a unit for storing data, and the cell array 710 is a data storage place in which a plurality of storage cells CELL are arranged in an array shape. The type of the storage cells CELL included in the cell array 710 may differ depending on the type of the memory circuit 700. For example, when the memory circuit 700 is DRAM, the storage cell CELL may include a cell capacitor and a cell transistor. When the memory circuit 700 is Flash memory, the storage cell CELL may be implemented with a transistor including a control gate and a floating gate.

The control circuit 720 receives a command, an address, data (not illustrated in FIG. 7) from outside the memory circuit 700, and writes the received data to a storage cell CELL designated by the address among the plurality of storage cells CELL of the cell array 710. Furthermore, the control circuit 720 receives a command and address from the memory circuit 700, reads data from a storage cell CELL designated by the address among the plurality of storage cells CELL of the cell array 710, and outputs the read data to the outside of the semiconductor device. The method of the control circuit 720 to write or read data to or from the cell array 710 may differ depending on the type of the memory circuit 700.

The power supply circuit 730 serves to supply power used in one or more of the cell array 710 and the control circuit 720. The power circuit 730 may generate power at a set voltage level and supply the generated power to one or more of the cell array 710 and the control circuit 720, when the memory circuit 700 is powered on. The power used in the cell array 710 may include power used for writing data to a storage cell CELL, reading data from a storage cell CELL, maintaining data of a storage cell CELL, or erasing data of a storage cell CELL. In addition, the power used in the cell array 710 may be supplied from the power supply circuit 730. The power used in the control circuit 720 may include power required for inputting/outputting data to/from the cell array 710 or power required for processing a signal inputted from outside or outputting a signal to the outside. Furthermore, the power used in the control circuit 720, including power required for controlling the operation of the cell array 710, may be supplied from the power supply circuit 730.

The power supply circuit 730 may include one of the above-described implementations of the power supply circuit. The power supply circuit 730 including the power supply circuit in accordance with the above-described implementations may include a voltage driving unit which pull-up drives an output node to generate an output voltage, and a driving control unit which receives an output voltage, disables the voltage driving unit from the time at which a divided voltage obtained by dividing the output voltage at a set ratio becomes higher than a first level, and enables the voltage driving unit from the time at which the divided voltage becomes lower than a second level higher than the first level. Since the power supply circuit stably supplies power, the memory circuit 700 may be stably operated, and the performance and reliability of the memory circuit 700 may be improved.

In accordance with the above-described implementations, the electronic device and the method for manufacturing the same may control the voltage driving unit using two reference voltages, thereby generating a stable voltage having small change.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

The above and other memory circuits or semiconductor devices based on the disclosed technology can be used in a range of devices or systems. FIGS. 8-12 provide some examples of devices or systems that can implement the power supply circuits disclosed herein.

Figure 8:
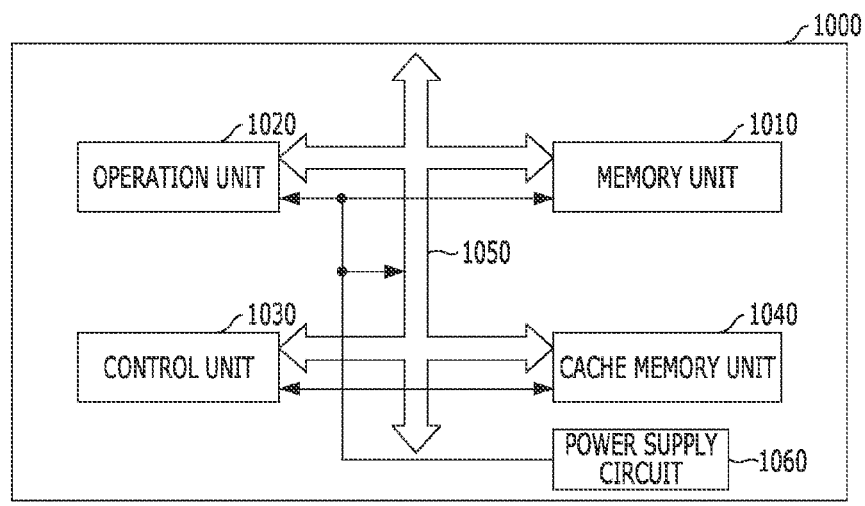
FIG. 8 shows an example of a configuration diagram of a microprocessor implementing memory circuitry based on the disclosed technology.

FIG. 8 shows an example of a configuration diagram of a microprocessor based on another implementation of the disclosed technology.

Referring to FIG. 8, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and an address where data for performing of the operations are stored.

The memory unit 1010 may include one or more of the above-described semiconductor devices in accordance with the implementations.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands and controlling input and output of signals of the microprocessor, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

The microprocessor 1000 may further include a power supply circuit 1060. The power supply circuit 1060 serves to supply power used in one or more of the memory unit 1010, the operation unit 1020, the control unit 1030, the cache memory unit 1040 and the bus interface 1050.

The power supply circuit 1060 may include one or more of the above-described semiconductor devices in accordance with the implementations. For example, the power supply circuit 1060 implementation may include a voltage driving unit configured to pull-up drive an output node and generate an output voltage, and a driving control unit configured to receive the output voltage, disable the voltage driving unit from the time at which a divided voltage obtained by dividing the output voltage at a set ratio becomes higher than a first level, and enable the voltage driving unit from the time at which the divided voltage becomes lower than a second level, which is higher than the first level. Through this, the power supply circuit 1060 supplies power to the microprocessor 1000 in a stable manner. Consequently, the operation of the microprocessor 1000 can be stabilized, thereby improving the performance and reliability of the microprocessor 1000.

Figure 9:
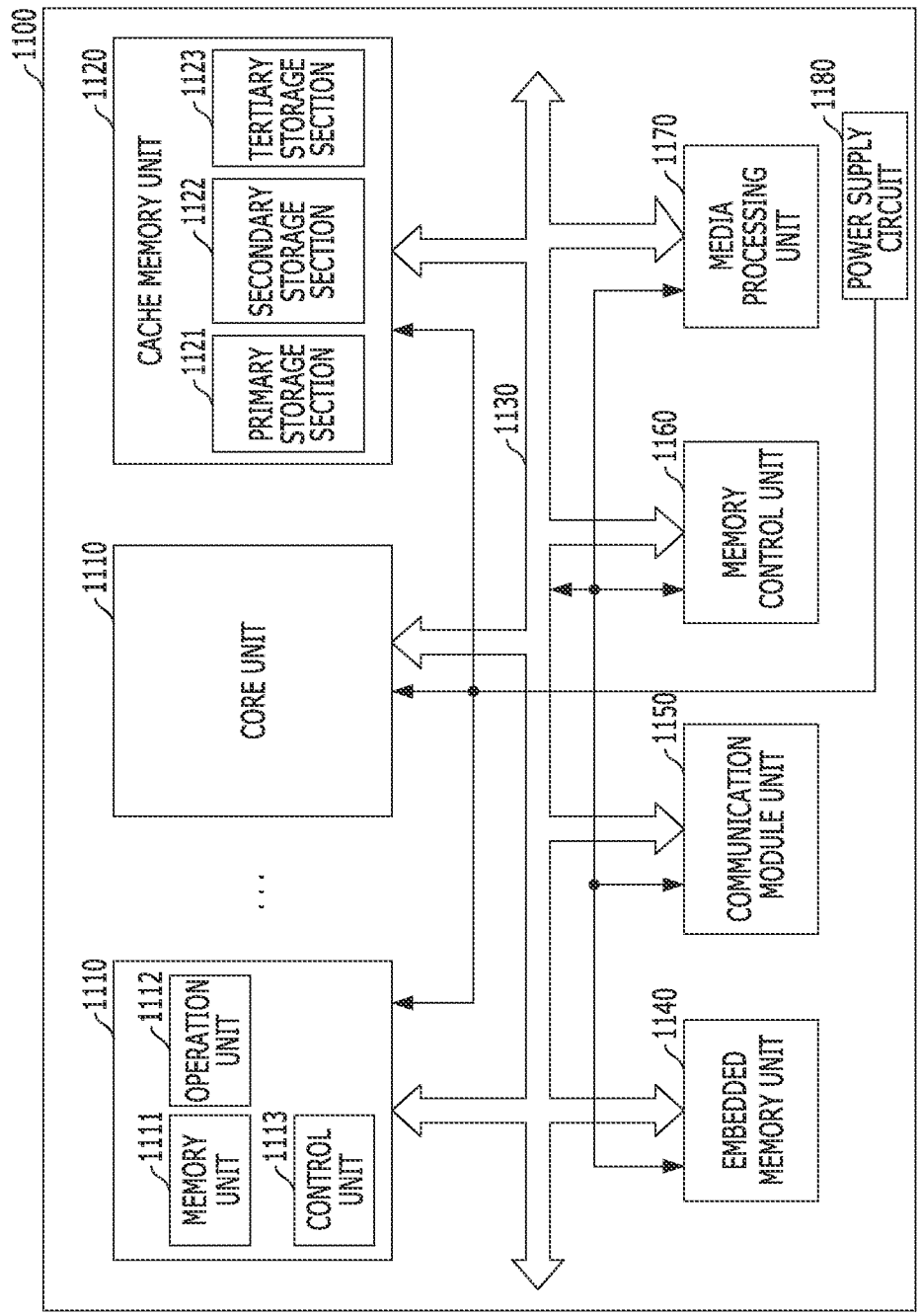
FIG. 9 shows an example of a configuration diagram of a processor implementing memory circuitry based on the disclosed technology.

FIG. 9 is a configuration diagram of a processor based on another implementation of the disclosed technology.

Referring to FIG. 9, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and an address where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage unit 1121, a secondary storage unit 1122 and a tertiary storage unit 1123. In general, the cache memory unit 1120 includes the primary and secondary storage units 1121 and 1122, and may include the tertiary storage unit 1123 in the case where high storage capacity is required. As the occasion demands, the cache memory unit 1120 may include an increased number of storage units. That is to say, the number of storage units which are included in the cache memory unit 1120 may be changed according to a design. The speeds at which the primary, secondary and tertiary storage units 1121, 1122 and 1123 store and discriminate data may be the same or different. In the case where the speeds of the respective storage units 1121, 1122 and 1123 are different, the speed of the primary storage unit 1121 may be largest. At least one storage unit of the primary storage unit 1121, the secondary storage unit 1122 and the tertiary storage unit 1123 of the cache memory unit 1120 may include one or more of the above-described semiconductor devices in accordance with the implementations.

Although it was shown in FIG. 9 that all the primary, secondary and tertiary storage units 1121, 1122 and 1123 are configured inside the cache memory unit 1120, it is to be noted that all the primary, secondary and tertiary storage units 1121, 1122 and 1123 of the cache memory unit 1120 may be configured outside the core unit 1110 and may compensate for a difference in data processing speed between the core unit 1110 and the external device. Meanwhile, it is to be noted that the primary storage unit 1121 of the cache memory unit 1120 may be disposed inside the core unit 1110 and the secondary storage unit 1122 and the tertiary storage unit 1123 may be configured outside the core unit 1110 to strengthen the function of compensating for a difference in data processing speed. In another implementation, the primary and secondary storage units 1121, 1122 may be disposed inside the core units 1110 and tertiary storage units 1123 may be disposed outside core units 1110. The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage unit 1121 of the cache memory unit 1120 may be configured in each core unit 1110 in correspondence to the number of the plurality of core units 1110, and the secondary storage unit 1122 and the tertiary storage unit 1123 may be configured outside the plurality of core units 1110 in such a way as to be shared through the bus interface 1130. The processing speed of the primary storage unit 1121 may be larger than the processing speeds of the secondary and tertiary storage unit 1122 and 1123. In another implementation, the primary storage unit 1121 and the secondary storage unit 1122 may be configured in each core unit 1110 in correspondence to the number of the plurality of core units 1110, and the tertiary storage unit 1123 may be configured outside the plurality of core units 1110 in such a way as to be shared through the bus interface 1130. The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data prepared in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory) and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), and a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

The processor 1100 may further include a power supply circuit 1180. The power supply circuit 1180 serves to supply power used in one or more of the core unit 1110, the cache memory unit 1120, the bus interface 1130, the embedded memory unit 1140, communication module unit 1150, memory control unit 1160 and the media processing unit 1170.

The power supply circuit 1180 may include one or more of the above-described semiconductor devices in accordance with the implementations. For example, the power supply circuit 1180 implementation may include a voltage driving unit configured to pull-up drive an output node and generate an output voltage, and a driving control unit configured to receive the output voltage, disable the voltage driving unit from the time at which a divided voltage obtained by dividing the output voltage at a set ratio becomes higher than a first level, and enable the voltage driving unit from the time at which the divided voltage becomes lower than a second level, which is higher than the first level. Through this, the power supply circuit 1180 supplies power to the processor 1100 in a stable manner. Consequently, the operation of the processor 1100 can be stabilized, thereby improving the performance and reliability of the processor 1100.

Figure 10:
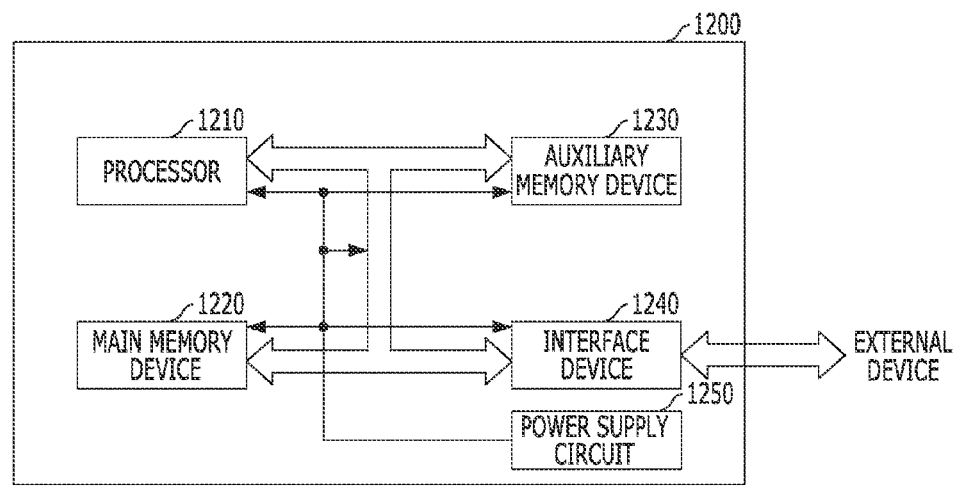
FIG. 10 shows an example of a configuration diagram of a system implementing memory circuitry based on the disclosed technology.

FIG. 10 is a configuration diagram of a system based on another implementation of the disclosed technology.

Referring to FIG. 10, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 decodes inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations.

Also, the auxiliary memory device 1230 may further include a data storage system (see the reference numeral 1300 of FIG. 11) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 11) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device and so on. The communication device may include a module capable of being connected with a wired network, a module capable of being connected with a wireless network and both of them.

The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

The system 1200 may further include a power supply circuit 1250. The power supply circuit 1250 serves to supply power used in one or more of the processor 1210, the main memory device 1220, the auxiliary memory device 1230 and the interface device 1240.

The power supply circuit 1250 may include one or more of the above-described semiconductor devices in accordance with the implementations. For example, the power supply circuit 1250 implementation may include a voltage driving unit configured to pull-up drive an output node and generate an output voltage, and a driving control unit configured to receive the output voltage, disable the voltage driving unit from the time at which a divided voltage obtained by dividing the output voltage at a set ratio becomes higher than a first level, and enable the voltage driving unit from the time at which the divided voltage becomes lower than a second level, which is higher than the first level. Through this, the power supply circuit 1250 supplies power to the system 1200 in a stable manner. Consequently, the operation of the system 1200 can be stabilized, thereby improving the performance and reliability of the system 1200.

Figure 11:
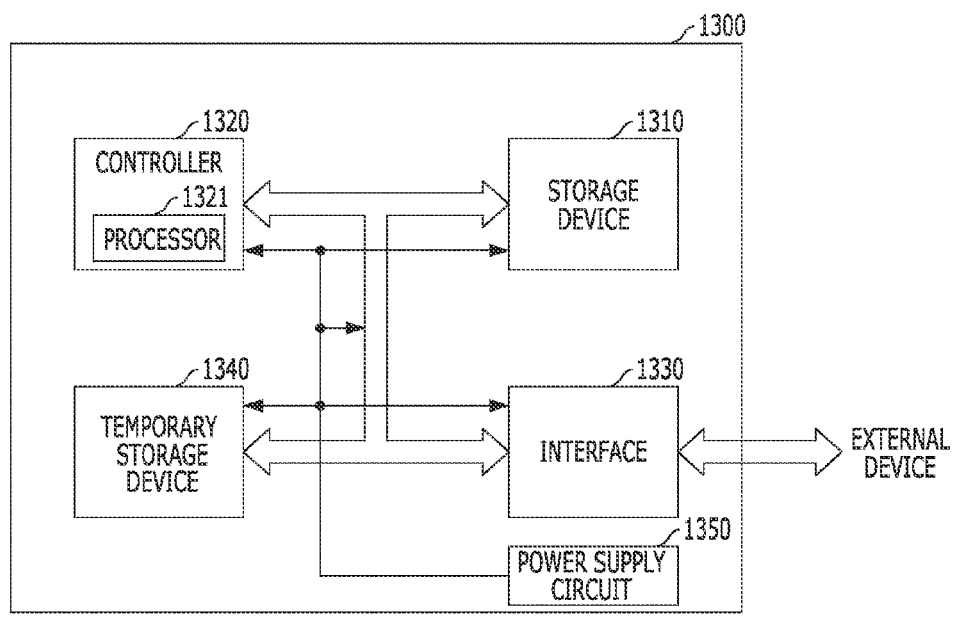
FIG. 11 shows an example of a configuration diagram of a data storage system implementing memory circuitry based on the disclosed technology.

FIG. 11 is a configuration diagram of a data storage system based on another implementation of the disclosed technology.

Referring to FIG. 11, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices.

In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily implementation for efficiently transferring data between the interface 1330 and the storage device 1310 according to diversifications and high performance of an interface with an external device, a controller and a system.

The data storage system 1300 may further include a power supply circuit 1350. The power supply circuit 1350 serves to supply power used in one or more of the storage device 1310, the controller 1320, the interface 1330 and the temporary storage device 1340.

The power supply circuit 1350 may include one or more of the above-described semiconductor devices in accordance with the implementations. For example, the power supply circuit 1350 implementation may include a voltage driving unit configured to pull-up drive an output node and generate an output voltage, and a driving control unit configured to receive the output voltage, disable the voltage driving unit from the time at which a divided voltage obtained by dividing the output voltage at a set ratio becomes higher than a first level, and enable the voltage driving unit from the time at which the divided voltage becomes lower than a second level, which is higher than the first level. Through this, the power supply circuit 1350 supplies power to the data storage system 1300 in a stable manner. Consequently, the operation of the data storage system 1300 may be stabilized, thereby improving the performance and reliability of the data storage system 1300.

Figure 12:
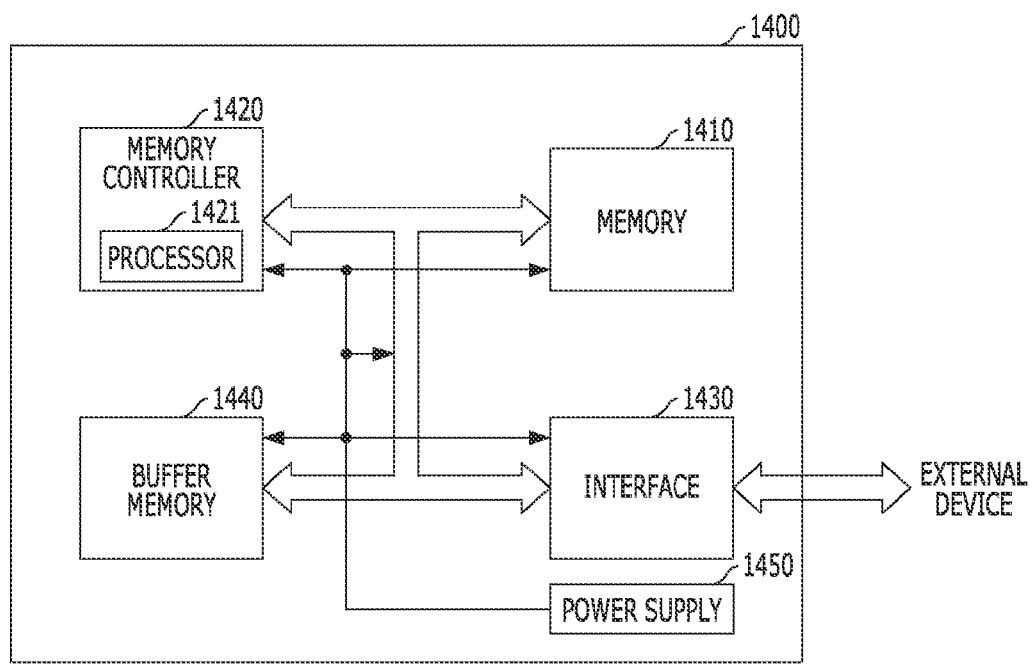
FIG. 12 shows an example of a configuration diagram of a memory system implementing memory circuitry based on the disclosed technology.

FIG. 12 is a configuration diagram of a memory system based on another implementation of the disclosed technology.

Referring to FIG. 12, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

The memory system 1400 may further include a power supply 1450. The power supply 1450 serves to supply power used in one or more of the memory 1410, the memory controller 1420, the interface 1430 and the buffer memory 1440.

The power supply circuit 1450 may include one or more of the above-described semiconductor devices in accordance with the implementations. For example, the power supply circuit 1450 implementation may include a voltage driving unit configured to pull-up drive an output node and generate an output voltage, and a driving control unit configured to receive the output voltage, disable the voltage driving unit from the time at which a divided voltage obtained by dividing the output voltage at a set ratio becomes higher than a first level, and enable the voltage driving unit from the time at which the divided voltage becomes lower than a second level, which is higher than the first level. Through this, the power supply circuit 1450 supplies power to the memory system 1400 in a stable manner. Consequently, the operation of the memory system 1400 can be stabilized, thereby improving the performance and reliability of the memory system 1400.

Features in the above examples of electronic devices or systems in FIGS. 8-12 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular implementations of particular inventions. Certain features that are described in this patent document in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a sub combination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the implementations described in this patent document should not be understood as requiring such separation in all implementations.

Only a few implementations and examples are described. Other implementations, enhancements and variations can be made based on what is described and illustrated.

What is claimed is:

1. An electronic device comprising a power supply circuit which comprises:
   a voltage driving unit configured to pull-up drive an output node and generate an output voltage; and
   a driving control unit configured to receive a delayed output voltage, disable the voltage driving unit from the time at which a divided voltage obtained by dividing the delayed output voltage at a set ratio becomes higher than a first level, and enable the voltage driving unit from the time at which the divided voltage becomes lower than a second level which is higher than the first level,
   wherein the delayed output voltage is generated by delaying the output voltage, and
   wherein the electronic device further comprises a semiconductor memory unit which comprises:
   a cell array comprising a plurality of storage cells configured to store data; and a control circuit configured to write data to the plurality of storage cells or read data from the plurality of memory cells, and the power supply circuit supplies power used in one or more of the cell array and the control circuit.

2. The electronic device of claim 1, wherein the driving control unit enables the voltage driving unit when the divided voltage is lower than the first level.

3. The electronic device of claim 1, wherein the driving control unit comprises:

a voltage division unit configured to divide the delayed output voltage at the set ratio and generate the divided voltage;

a first comparison unit configured to compare the divided voltage with a voltage having the first level and generate a first comparison signal;

a second comparison unit configured to compare the divided voltage with a voltage having the second level and generate a second comparison signal; and an enable signal generating unit configured to enable or disable the voltage driving unit in response to the first comparison signal and the second comparison signal.

4. The electronic device of claim 3, wherein the first comparison unit deactivates the first comparison signal when the divided voltage is lower than the first level, and activates the first comparison signal when the divided voltage is higher than the first level, the second comparison unit deactivates the second comparison signal when the divided voltage is lower than the second level, and activates the second comparison signal when the divided voltage is higher than the second level, and the enable signal generating unit disables the voltage driving unit when the first comparison signal transits from a deactivated state to an activated state, and enables the voltage driving unit when the second comparison signal transits from an activated state to a deactivated state.

5. The electronic device of claim 3, wherein the enable signal generating unit enables the voltage driving unit when the first comparison signal is deactivated.

6. The electronic device according to claim 1, further comprising a microprocessor which includes:

a control unit that is configured to receive a signal including a command from an outside of the microprocessor, and performs extracting, decoding of the command, or controlling input or output of a signal of microprocessor; and an operation unit configured to perform an operation based on a result that the control unit decodes the command; and a memory unit configured to store data for performing the operation, data corresponding to a result of performing the operation, or an address of data for which the operation is performed, wherein one or more of the control unit, the operation unit and the memory unit are received power of the power supply circuit.

7. The electronic device of claim 1, wherein the storage cells in the cell array include variable resistance elements each exhibiting different resistance states depending on a voltage or current applied across the variable resistance element to store data.

8. The electronic device of claim 1, wherein the plurality of storage cells comprise a volatile memory cell which requires electricity to maintain data stored therein.

9. The electronic device of claim 1, wherein the plurality of storage cells comprise a nonvolatile memory cell which does not require electricity to maintain data stored therein.

10. The electronic device of claim 1, wherein the plurality of storage cells comprise a resistance variable element of which a resistance value is set according to the value of data stored therein.

11. An electronic device comprising a power supply circuit which comprises:

a voltage driving unit configured to pull-up drive an output node and generate an output voltage; and a driving control unit coupled to receive a delayed output voltage and coupled to the voltage driving unit to (1) disable the voltage driving unit from the time at which a divided voltage obtained by dividing the delayed output voltage at a set ratio becomes higher than a first level, and (2) enable the voltage driving unit from the time at which the divided voltage becomes lower than a second level which is higher than the first level, and wherein the electronic device further comprises a semiconductor memory unit, wherein the semiconductor memory unit comprises:

a cell array comprising a plurality of storage cells configured to store data; and a control circuit configured to write data to the plurality of storage cells or read data from the plurality of memory cells, and the power supply circuit supplies power used in one or more of the cell array and the control circuit.

12. The electronic device of claim 11, wherein the plurality of storage cells comprise a volatile memory cell which requires electricity to maintain data stored therein.

13. The electronic device of claim 11, wherein the plurality of storage cells comprise a nonvolatile memory cell which does not require electricity to maintain data stored therein.

14. The electronic device of claim 11, wherein the plurality of storage cells comprise a variable resistance element of which a resistance value is set according to the value of data stored therein.

15. The electronic device of claim 14, wherein the variable resistance element comprises one or more of a metal oxide, a phase change material, and a structure having a tunnel barrier layer interposed between two magnetic layers.

16. The electronic device of claim 11, wherein the storage cells in the cell array include variable resistance elements each exhibiting different resistance states depending on a voltage or current applied across the variable resistance element to store data.

17. An electronic device comprising a power supply circuit which comprises:

a voltage driving unit configured to pull-up drive an output node;

a voltage transmission line configured to transmit an output voltage generated at the output node to an input node; and a driving control unit configured to initially activate the voltage driving unit, and disable the voltage driving unit when a divided voltage obtained by dividing the voltage of the input node at a set ratio becomes higher than a first level, and enable the voltage driving unit when the divided voltage becomes lower than a second level which is higher than the first level, wherein the voltage transmission line delays the output voltage of the output node in transmitting the output voltage from the output node to the input node, and wherein the electronic device further comprises a semiconductor memory unit which comprises:
- a cell array comprising a plurality of storage cells configured to store data; and
- a control circuit configured to write data to the plurality of storage cells or read data from the plurality of memory cells, and
- the power supply circuit supplies power used in one or more of the cell array and the control circuit.

18. The electronic device of claim 17, wherein the driving control unit enables the voltage driving unit when the divided voltage is lower than the first level.

19. The electronic device of claim 17, wherein the driving control unit comprises:
- a voltage division unit configured to divide a voltage of the input node at the set ratio and generate the divided voltage;
- a first comparison unit configured to compare the divided voltage with a voltage having the first level and generate a first comparison signal;
- a second comparison unit configured to compare the divided voltage with a voltage having the second level and generate a second comparison signal; and
- an enable signal generating unit configured to enable or disable the voltage driving unit in response to the first comparison signal and the second comparison signal.

20. The electronic device of claim 19, wherein the first comparison unit deactivates the first comparison signal when the divided voltage is lower than the first level, and activates the first comparison signal when the divided voltage is higher than the first level,
- the second comparison unit deactivates the second comparison signal when the divided voltage is lower than the second level, and activates the second comparison signal when the divided voltage is higher than the second level, and
- the enable signal generating unit disables the voltage driving unit when the first comparison signal transits from a deactivated state to an activated state, and enables the voltage driving unit when the second comparison signal transits from an activated state to a deactivated state.

21. The electronic device of claim 19, wherein the enable signal generating unit enables the voltage driving unit when the first comparison signal is deactivated.

22. An electronic device comprising a power supply circuit which comprises:
- a voltage driving unit generating an output voltage by driving an output node if activated and floating an output node if deactivated, wherein the output voltage is fed back to an input node of a power supply circuit to provide an input voltage; and
- a driving control unit receiving the input voltage and activating or deactivating an enable signal to activate or deactivate the voltage driving unit in consideration of a delay in feeding back the output voltage from the output node to the input node, and
- wherein the electronic device further comprises a semiconductor memory unit which comprises:
- a cell array comprising a plurality of storage cells configured to store data; and
- a control circuit configured to write data to the plurality of storage cells or read data from the plurality of memory cells, and
- the power supply circuit supplies power used in one or more of the cell array and the control circuit.

23. The electronic device of claim 22, wherein the driving control unit activates or deactivates the enable signal by using a first reference signal lower than a target value of the output voltage generated at the output node and a second reference signal higher than the target value.

24. The electronic device of claim 22, wherein the driving control unit activates or deactivates the enable signal before the output voltage reaches a target value of the output voltage.

25. The electronic device of claim 22, wherein the storage cells in the cell array include variable resistance elements each exhibiting different resistance states depending on a voltage or current applied across the variable resistance element to store data.

* * * * *